United States Patent [19]
Greiner et al.

[11] Patent Number: 5,647,544
[45] Date of Patent: Jul. 15, 1997

[54] METHOD AND APPARATUS FOR DIVIDING AND SEPARATING SELF-ADHESIVE COMPOSITE PLASTIC MATERIALS

[75] Inventors: Ralph Greiner, Leonberg; Michele Melchiorre, Blaustein; Björn Stückrad, Ulm, all of Germany

[73] Assignee: Daimler-Benz AG, Stuttgart, Germany

[21] Appl. No.: 610,628

[22] Filed: Mar. 4, 1996

[30] Foreign Application Priority Data

Mar. 2, 1995 [DE] Germany ............... 195 07 218.9

[51] Int. Cl.⁶ .................... B02C 19/12; B02C 23/20
[52] U.S. Cl. ............... 241/17; 241/20; 241/24.12; 241/79.1; 241/DIG. 38
[58] Field of Search ............... 241/17, 20, 24.12, 241/79.1, DIG. 37, DIG. 38

[56] References Cited

U.S. PATENT DOCUMENTS

| | | | |
|---|---|---|---|
| 2,879,005 | 3/1959 | Jarvis | 241/17 X |
| 2,892,697 | 6/1959 | Davies et al. | 241/17 X |
| 3,718,284 | 2/1973 | Richardson | 241/23 |
| 4,020,992 | 5/1977 | Binger et al. | 241/18 |
| 4,340,076 | 7/1982 | Weitzen | 241/DIG. 37 X |
| 5,257,740 | 11/1993 | Prew et al. | 241/21 |
| 5,358,184 | 10/1994 | Skudrzyk | 241/16 |
| 5,421,526 | 6/1995 | Johansson et al. | 241/20 |

FOREIGN PATENT DOCUMENTS

| | | |
|---|---|---|
| 535419 | 4/1993 | European Pat. Off. . |
| 2423367 | 2/1975 | Germany . |
| 4216638 | 9/1993 | Germany . |

OTHER PUBLICATIONS

Chem.Ing.-Tech 66 (1994), Nr. 5,S.661–669, "Reilen und Trennen im Recycling-Prozeβ, Michle Melchiorre, Martin Güldenpfenning, Karsten Löohr und Jörg Zürn".

UMWELT Bd. 24 (1994) Nr. 4–Apr., pp. 152–153, "Aluminium-Kunststoff-Verbundmaterial trennen und verwerten," Prof. Dr. Thomas Mang, FH Aachen,Fachbereich Chemieingenieurwesen Schwerpunkt Kuntstofftechnolgie.

MULL und ABFALL Jun. 1984, pp. 183–186, "Anwendung der Tiefftemperature-Technik beim Recycling von Verbundstoffen, Von Frank Burmester".

*Primary Examiner*—John M. Husar
*Attorney, Agent, or Firm*—Evenson, McKeown, Edwards & Lenahan, P.L.L.C.

[57] ABSTRACT

A method and apparatus for the single type recovery of plastic materials from starting pieces of a multiple composite material is disclosed. The starting pieces are firstly comminuted mechanically into particles of a size compatible with the process. These composite materials particularly are separated and a mixture of different materials is produced and, from this material mixture, the individual materials are isolated. For the recovery of starting pieces of prepreg fabric from flexible cutting residues, lined with films on both sides, the following steps are performed in sequence. First, the starting pieces are comminuted by cutting them up into shreds of composite material. Then the shreds of composite material are cooled down to temperatures below room temperature and, in a cold state, are subjected to a mechanical alternating bending stress and/or a shearing stress, the films becoming detached from the prepreg pieces in a scale-like manner to form a mixture. This mixture of film clippings and free prepreg pieces is subjected to a wet, density-selective flotation-like float and sink separation, the films floating and the free prepreg pieces sinking.

36 Claims, 3 Drawing Sheets

METHOD AND APPARATUS FOR DIVIDING AND SEPARATING SELF-ADHESIVE COMPOSITE PLASTIC MATERIALS

BACKGROUND AND SUMMARY OF THE INVENTION

The invention relates to a method and apparatus for the recovery of plastic materials from starting pieces of composite fiber materials including fiber fabrics preimpregnated with a matrix plastic material forming prepreg structures and covered by protective films. German Patent Document DE41 16 638 A1 relates to plastic materials of the type contemplated by the present invention.

In aircraft construction and increasingly also in automobile and sports equipment construction, particular demands are placed on the properties of the materials used, which can be fulfilled by using sometimes very expensive composite fiber materials, so-called prepregs (preimpregnated). These prepregs usually consist of carbon fiber fabrics which are preimpregnated with a matrix plastic material. The matrix plastic materials used are preferably strongly adhesive epoxy or phenolic resins. Further examples of such self-adhesive composite plastic materials are glass fiber fabrics which are likewise impregnated with phenolic resin. In order to enable the adhesive fabrics to be stored, transported and cut to size, the fabrics are provided on both sides with protective films of polyethylene or impregnated paper. During the processing of such prepregs, supplied in rolled webs, e.g. in the manufacture of rudder units for aircraft, non-cured cutting residues of these expensive prepregs occur. The cutting residues currently have to be disposed of as special waste, which is cost-intensive. Owing to the high value of the material and the cost intensive disposal of the cutting residues, there is an urgent requirement to find more economical possibilities of recovering and reusing these materials. In this regard, on the one hand preservation usually of large areas of the fabric structure, but especially preservation of the fiber structure is to be guaranteed, i.e. fiber damage is to be avoided and, on the other hand, a chemical modification of the reactive resin and thus a permanent change to the adhesive strength of the fabric are to be avoided. Hitherto there have only been manual methods for dividing and separating self-adhesive, flexible films from a flexible backing material. However, manual separation of the protective films from the prepreg residues is very expensive and makes a manually assisted recovery method economically inviable.

Dwindling reserves of raw materials and diminishing landfill areas for waste disposal have led to the development of various recycling methods. In this regard, the recycling of composite materials places particular demands on such methods. Firstly, the composite material has to be comminuted and, in a following step, the composite particles thus obtained have to be divided into their individual material components and segregated from any mixture.

Currently applied methods for cutting up or dividing the composite of different materials are based on the selective separation of individual composite components or of the adhesive agent [Mang, T.; Umwelt 24, p.152–153, 1994] or on the selective comminution of individual composite components, cf. for example the publication DE 42 16 638 A1 referred to above. In some cases, this selective comminution is only made possible by cooling down to the temperature of liquid nitrogen (–196° C.) and thus causing the material to become brittle [Burmester, F.; Mull Abfall 16(6), p.183–186, 1984]. Such methods cannot be applied if the composite component(s) to be recycled must not be damaged.

In the subsequent separation of material mixtures, differences in the densities of the individual components of the mixture are currently usually exploited. Examples which can be mentioned here are the separation of plastics mixtures by means of dry methods, such as wind sifting [Melchiorre, M., Güldenpfennig, M., Löhr, K., Zurn, J.; Chemie-Ingenieur-Technik 66(5), p.661–670, (1994)] or by means of wet methods, such as float and sink separation, or by means of hydrocyclones [Bahr, A.; Erzmetall 33, p.324–330, (1980)]. In addition to the density dependence, the methods mentioned first and last also have developments of the method in order to be able to take account of influences of the particle shape and particle sizes in the selection. To apply the float and sink method, a homogeneous liquid of a suitable density must be available, e.g. a solution or a dispersion or emulsion. In the specific case applicable here of sorting plastics mixtures with adhesive and/or chemically reactive surfaces, the potential for choice of the liquid separating medium is greatly restricted. The dry methods mentioned cannot be applied for sorting strongly adhesive materials. Since the cutting material to be treated in this case occurs in different shapes and sizes and usually above the maximum particle size suitable for hydrocyclones, hydrocyclones cannot be used.

Another method for separating material mixtures is flotation [cf. for example EP 535 419 A1]. Instead of density, this method uses the wettability of the particle surface as the selection parameter. This selection parameter is exploited in the flotation method by suspending the comminuted mixture in a liquid (usually water) and there subjecting it to a stream of rising gas bubbles (usually air). These gas bubbles accumulate selectively on the mixture components in accordance with the wettability thereof. Good wettability of the particle surface by the suspension liquid brings about poor bubble accumulation and vice versa. Mixture components which have a sufficient accumulation of bubbles rise to the surface; the other components remain in the suspension. Mixtures actually occurring do not usually have sufficient differences in the wettability of their components to enable sorting to be carried out by means of flotation. The wettability of the mixture components must therefore be selectively modified by so-called conditioning, i.e. by adding surface-reactive chemicals to the suspension. In the present specific case of sorting plastics mixtures with adhesive and/or chemically surfaces, the potential for choice of such conditioning reagents is greatly restricted.

An object of the invention is to divide such self-adhesive composite materials, such as are represented by the above-mentioned film-lined cutting residues of prepreg webs or similar self-adhesive webs, automatically into the individual substance components, taking into account the restrictions mentioned, and to isolate, i.e. to separate, the materials from the mixture thus produced.

According to the invention, this object is achieved by providing a method comprising the following sequential steps:

mechanically comminuting the starting pieces into shreds of composite material;

cooling the shreds of composite material to temperatures below ambient room temperature;

subjecting the shreds of composite material to alternating mechanical stresses and thereby scaling off the protective films from the prepreg structures to form a mixture of film clippings and free prepreg pieces;

and subjecting the mixture of film clippings and free prepreg pieces to a wet density selective separation process.

According to preferred embodiments of the invention, the adhesive strength of the resin is firstly weakened in a purely physical manner by cooling, preferably in an aqueous medium. Subsequently, alternating bending, axial and/or shearing stresses divide the weakened composite material into its components as a result of mechanical deformations of the pieces of fabric so that the film clippings become detached from the prepreg pieces in a scale-like manner. An aqueous medium reduces the adhesive effect of the resin sufficiently to prevent the pieces of fabric adhering to one another or to the protective films or to the walls of the processing plant. The divided components (prepreg fabrics and protective films) have sufficient differences in their densities, at least after an accumulation of air, to make density separation possible. Thus, for example, strongly adhesive carbon fiber fabrics impregnated with epoxy resin or even glass fiber fabrics impregnated with phenolic resin can, by means of this method, be divided and separated from the protective films surrounding them made of polyethylene or even of impregnated paper. It is also conceivable, in the case of web pieces and lining films of equal density, instead of the density-selective float and sink method, even to envisage a pure, i.e. wetting-selective, flotation method with preceding selective conditioning of the components. In this case, it may be necessary to pay careful attention in the selection of the conditioning agents to the fact that they do not impair the reactivity of the web materials to be recovered.

Other objects, advantages and novel features of the present invention will become apparent from the following detailed description of the invention when considered in conjunction with the accompanying drawings.

DETAILED DESCRIPTION OF THE DRAWINGS

Figure 3:
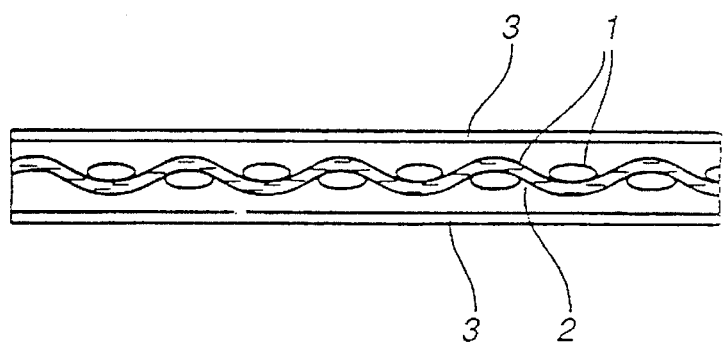
FIG. 3 shows a greatly enlarged cross-section through a piece of a prepreg fabric protected by film on both sides which is a starting piece to be processed according to the present invention.
Figure 4:
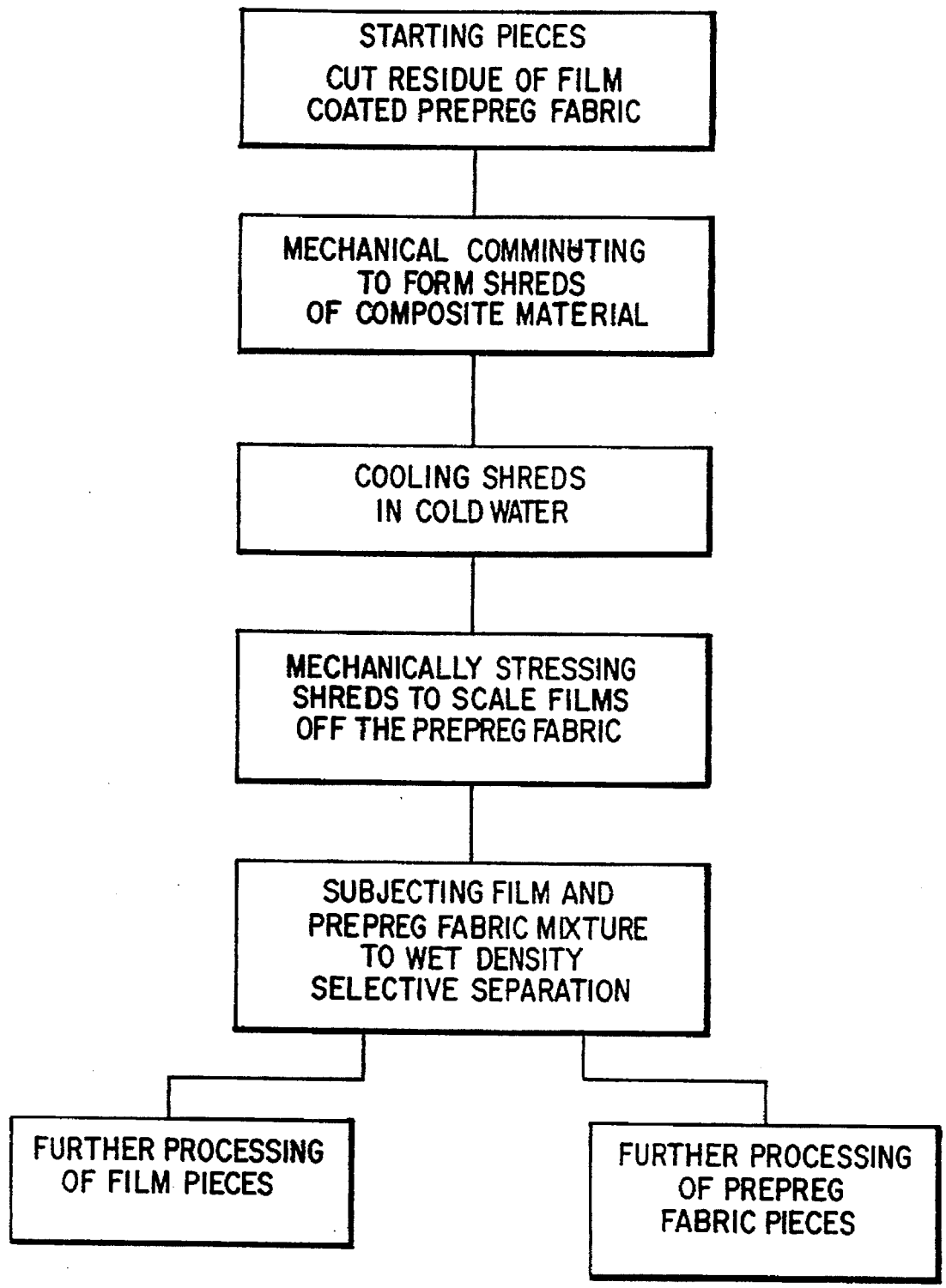
FIG. 4 is a flow chart schematically depicting the process according to preferred embodiments of the present invention.

The composite plastic materials to be processed are cutting residues of prepreg fabrics protected by film on both sides (FIG. 3), in which a fabric 1 of carbon or glass fibers is embedded and impregnated in a curable, but still reactive molding compound 2 in the form of a synthetic resin. The top side and the underside of the web-shaped structure produced in this manner are covered with an adhering film 3 to preserve the storability and handling capacity. Owing to their natural elasticity in the noncured state, the pieces of fabric ½ can be deformed mechanically without breaking. On the other hand, the reactivity of the prepreg residues is to remain fully intact. The cutting residues must nevertheless be comminuted to a size compatible with the process and thus brought into a processable, i.e. homogenized form. There is no particular upper limit to the size of the pieces of fabric used. The size results from the size of cutting residues occurring and of the homogenized shape and size of the pieces of fabric required for recycling. There is minimum size due to the required preservation of the fabric structure. The suitable size of the pieces of fabric is about 1 to 200 $cm^2$, preferably about 10 $cm^2$ to 60 $cm^2$. This size of the pieces of fabric used is achieved in that the cutting residues occurring are converted to the desired size by customary comminution methods, such as for example cutting or punching, which is preferably carried out in a dry state. This method step is not illustrated in the drawing FIGS. 1-3, but is schematically depicted in FIG. 4.

The further method steps are carried out in a wet state, at least in the illustrated exemplary embodiments of the plant and its components, i.e. the particles to be treated are suspended in a suitable treatment liquid. Owing to the reactive resin 2, there is actually a great restriction—as mentioned—in the choice of a suitable treatment liquid, such as is required especially as separating liquid for the float and sink method described below. Surprisingly, however, the reduction in the adhesive strength of the resin achieved by the cold water is completely reversible by merely drying the prepreg cuttings. For nonaqueous liquids, such evidence would have to be provided separately, as appropriate.

The division of the composite of self-adhesive pieces of fabric and protective films is made possible by cooling in the liquid medium. Moreover, the liquid medium prevents renewed adhering of the pieces of fabric to one another or to the protective films or the walls of the processing plant. As mentioned, water is preferably used as liquid medium since all the components of the composite plastic materials mentioned neither react with water nor are soluble therein within the temperature ranges and reaction times examined. Moreover, the use of water is sensible for economic and ecological reasons. In principle, however, water which contains salts or a solution of water and an organic solvent, e.g. ethyleneglycol, or a pure organic solvent can also be used as soon as any effect which is harmful to the material can be ruled out—possibly on the basis of a low concentration or on the basis of short reaction times or for both reasons.

Figure 1:
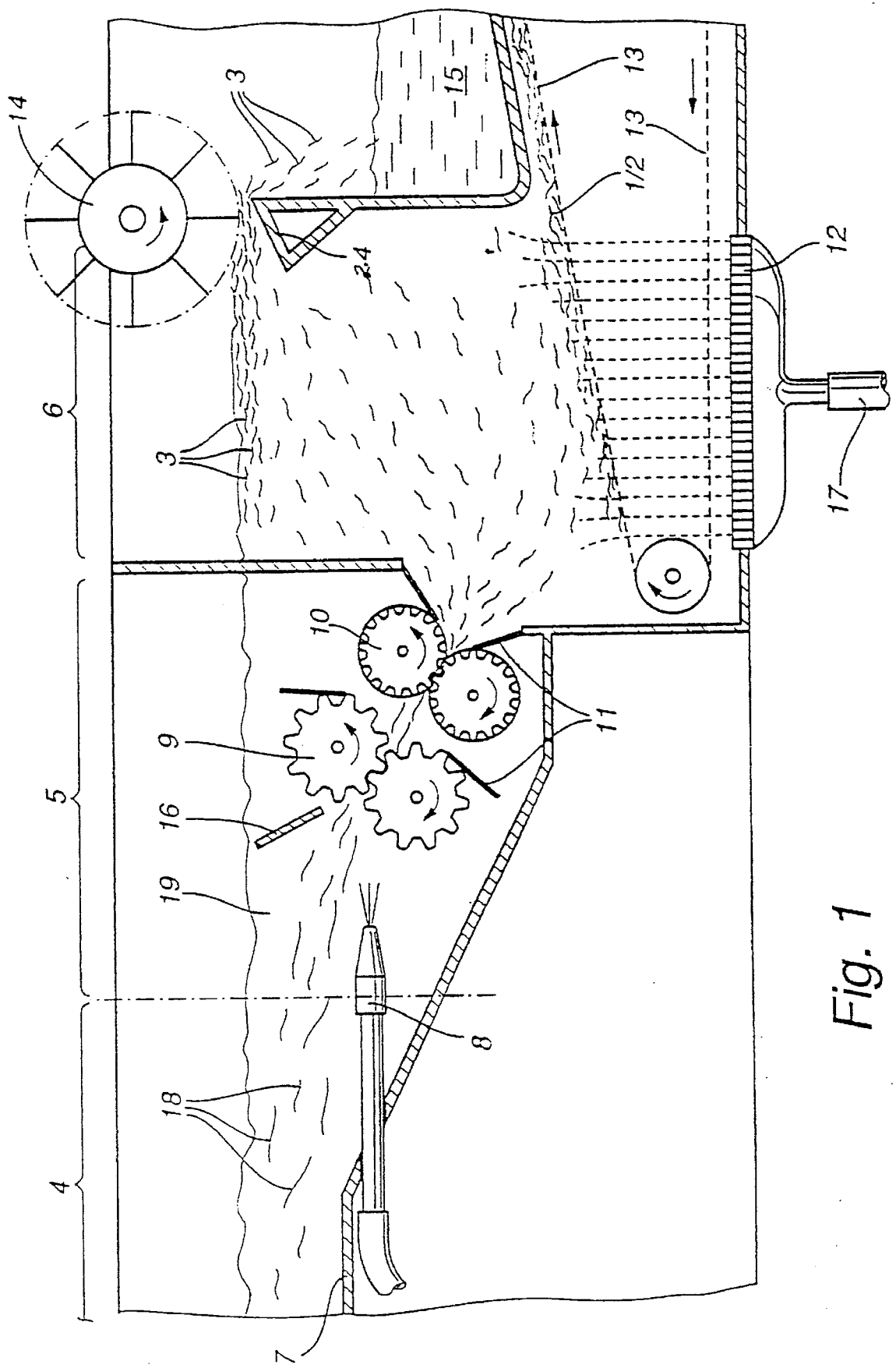
FIG. 1 is a schematic view which shows a partial extract of an exemplary embodiment of a plant for carrying out the division and separation method of the invention using two pairs of fulling rollers in the method step of "division"

In the plant illustrated in FIG. 1, a cooling channel 7 is provided in the cooling region 4, into which cooling channel the comminuted shreds 18 of composite material are introduced. After a relatively short residence time of a few seconds, they assume the temperature of the undercooled treatment liquid 19. An at least slow flow in the cooling channel in the direction of the downstream process region of "division" (5) can be maintained by advancing means (not illustrated), such as for example a slight gradient, injection nozzles, a conveying worm or drag bars. Sufficient cooling of the composite material 18 is achieved by setting the temperature of the liquid medium to 0° C. to 5° C., preferably 0° C. to 1° C. At these temperatures, although the adhesive effect of the resin is, on the one hand, already sufficiently reduced, on the other hand the pieces of fabric are still sufficiently flexible to pass through the mechanical deformation without mechanical damage, e.g. breaking or tearing of individual fibers. If, instead of in water, the cooling takes place in one of the other liquid media mentioned above, lower temperatures down to −10° C. are also suitable.

In the cooled state, the shreds 18 of composite material pass into the process region 5 for division; there the pieces of fabric are subjected to mechanical deformations. As a result of this mechanical deformation by means of alternating bending stress, axial and shearing loads act on the individual components of the composite plastic material.

The different elasticity of the components and the reduced adhesive strength cause the films 3 to be torn apart and detached in a scale-like manner from the pieces of prepreg fabric ½, such that the composite is divided into its individual components.

The mechanical deformation can be imposed in different ways according to respective preferred embodiments of the invention. Fulling rollers which rotate in opposite directions and have a gearwheel-like profile, the profile depth and diameter of which can be adapted in an optimum manner to the composite plastic materials to be separated have proved to be successful. In this case, the pairs of rollers can be arranged vertically or even horizontally. The horizontal arrangement of the roller axes with a roller nip aligned at least approximately perpendicularly and with a passage direction directed from the top to the bottom is preferably used, since this arrangement allows automatic drawing-in of the fabric parts by utilizing the force of gravity.

Arranged horizontally one behind the other in the plant illustrated in FIG. 1 are two pairs of fulling rollers 9 and 10, the respective rollers of which rotate in opposite directions and have a different diameter and a different roller profile for the two pairs. The passage direction through the pairs of rollers is aligned to correspond to a gradient representing gravity induced downward movement of the pieces of fabric prepreg in the form of shreds 18. The drawing-in of the pieces of fabric is achieved by a flow which is directed onto the drawing-in nip of the first pair of fulling rollers 9 and is generated by a row of nozzles 8. An adjustable flow guide plate 16 further promotes an orderly inflow of the shreds 18 of composite material into the drawing-in region of the pairs of fulling rollers. In order to prevent the composite plastic materials becoming jammed therein, a specific spacing within the region of a few millimeters is to be set between the circumference of the individual rollers of a pair, depending on the type of material to be separated, which spacing is optimized empirically. The influence of the rotary speed of the rollers on the separation characteristics is very small within a specific range of rotary speeds. The profile strips of the first pair of fulling rollers 9 were aligned in straight lines and parallel to the generating lines in the laboratory apparatus described below, whereas the far finer profiling of the second pair of fulling rollers 10 was formed by a convolution-type toothing. In order to prevent the pieces of fabric ½, some of which are still slightly sticky, adhering to the fulling rollers, stationary scraper blades 11 are placed against the circumference of the fulling rollers after the working nip, which scraper blades scrape off the adhering pieces of fabric or film and return them to the treatment bath.

Figure 2:
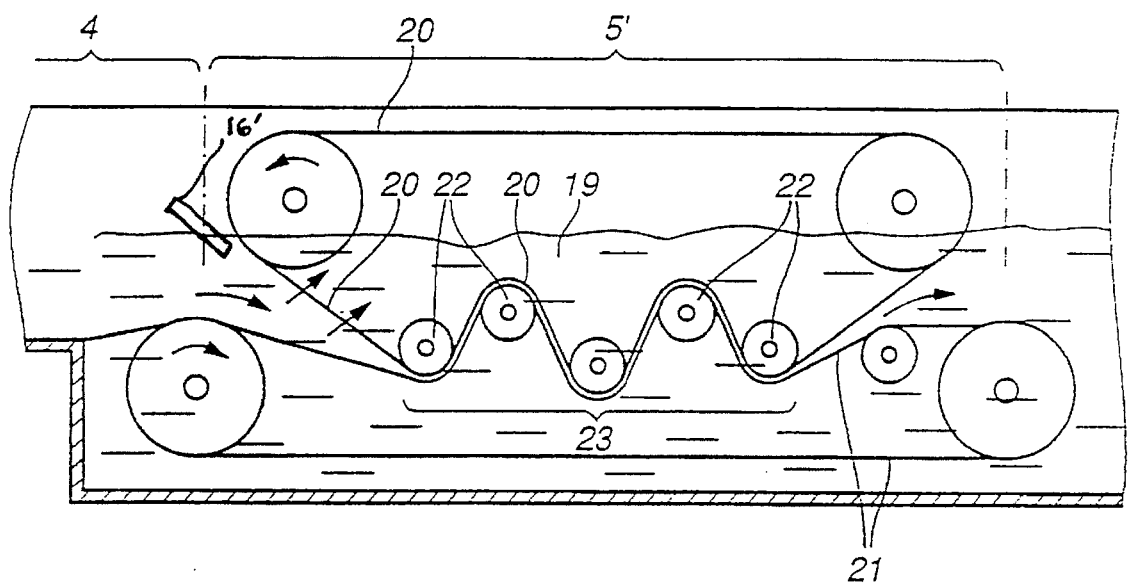
FIG. 2 shows a side view of a component of the method for the method step of "division" in the form of a double belt conducted in a meandering manner.

As further possibilities of separating the composite plastic material according to other contemplated embodiments, the necessary deformation work can be performed, for example, by stirrers or—see FIG. 2—by a double belt conducted in a meandering manner. In a modified process region of "division" 5', such a double belt can be formed from an upper 20 and a lower endless belt 21, which belts are arranged one above the other within the operating route 23 and are conducted lying one on top of the other over deflection rollers 22, arranged offset, in a zigzag manner with relatively small deflection radii. Between the belts 20 and 21, the composite plastic parts follow the course of the deformation profile given by the rollers 22. Here too, the shreds 18 of composite material are flushed by a directed flow coming from the cooling region 4 into the drawing-in region of the tapering drawing-in nip of the endless belts 20 and 21, which adjoins the two front deflection rollers. The further control of the conveyance of the shreds 18 is performed by an optimized basin design and flow control, e.g. by means of guide plates 16'. In order to prevent the shreds of composite material 18 flushed in being forced out of the tapering drawing-in nip at the lateral belt edges with the displaced liquid, at least one of the endless belts is expediently designed to be permeable, e.g. as a sieve or as a perforated web, such that the displacement of the liquid from the tapering drawing-in gap takes place transversely through the endless belt.

Returning to the plant according to FIG. 1, reference is now made to the third part of the plant, namely the separation region 6. The outlet flow of the rotating pairs of fulling rollers 9 and 10 transports the components which have been divided up but are still mixed, namely films 3 and pieces of prepreg fabric ½ of the former composite plastic material into the separation region 6 of the processing plant.

In water alone, both the pieces of fabric ½ and the protective films 3 sink to the bottom of the basin due to their respective density. In order nevertheless to be able to separate the prepreg residues ½ from the clippings of the films 3, according to the invention a novel wet density separation method is used. Specifically, in contrast to the customary float and sink methods, the density of the surrounding liquid is not adjusted to correspond to the requirement, but rather the density of the mixture components is modified in a "flotative" manner. That is to say this modification takes place with a specific analogy to the flotation method by the accumulation of air bubbles. However, in contrast to flotation, in the present case it is the overall density of the air/particle combination and not the wettability which is characteristic of the selection effect. This is because the pieces of fabric and protective films have wettability values of similar magnitude and correspondingly accumulate approximately the same number of air bubbles. Owing to the different overall density of the prepreg/air particles in comparison with that of the film/air particles, the lighter component requires a smaller surface density of accumulated air bubbles in order to rise to the surface compared to the heavier component. This leads to different residence times and allows a sharp separation into rising and sinking mixture components.

In the separation region 6, the parts of the mixture pass through a flow of gas bubbles (usually air). This gasification can take place, as shown for example in FIG. 1, through a porous bottom plate 12 with a compressed-air supply 17, but also through other processes and devices known in the flotation method of technology. The different mixture components ½ and 3 accumulate a similar number of gas bubbles. Owing to the different densities of the components, the lighter component requires a smaller surface density of air bubbles in order to rise to the surface compared to the heavier component. This leads to different residence times and to a sharp separation into rising components and sinking components. In other words: since the thinner films 3 in comparison with the thicker pieces of fabric ½ have a larger specific surface area in terms of mass, the films accumulate relatively more air, in particular a sufficient amount of air to be able to float in the treatment liquid. The films 3 rise to the surface of the bath, whereas the pieces of prepreg fabric ½ sink despite the accumulation of air. The films 3 can be discharged via a scraper board 24, arranged near to the surface, by means of a smoothing roller 14 into a flushing groove 15. The films 3 can then be conveyed away by and from the flushing groove for further processing.

In the plant according to FIG. 1, the pieces of fabric ½ sink onto an air-permeable discharge belt 13 which is arranged in an ascending manner in its upper strand and raises the prepreg pieces above the level of liquid in the treatment chamber, where they can be further processed in a suitable manner. It is contemplated, for example, for the discharged prepreg pieces to be blowdried, at least roughly, with compressed air while they are still lying on the discharge belt 13.

On completion of the division and separation, the respective composite components can be passed on for further processing steps in a suitable manner.

Relating to the present invention, some explanatory examples are referred to below:

EXAMPLE 1

A mixture of pieces of prepreg fabric impregnated with epoxy resin of the size 30×30 mm to 40×80 mm, on which in each case a polyethylene film is stuck on one side and a paper film on the other side, is introduced into a specially constructed laboratory plant. In this laboratory plant, the prepreg pieces are firstly cooled by water at about 1° C. After about 5 seconds, the prepreg pieces are conducted by a directed water flow through two pairs of profiled rollers arranged vertically one above the other and rotating in opposite directions. In this process, a mechanical deformation of the prepreg pieces takes place. With the passage of the cooled starting cuttings, the film becomes detached from the prepreg piece and a mixture of "bare" prepreg pieces and film clippings is produced. From this mixture, the prepreg pieces and the protective film pieces are separated from one another by means of the float and sink method mentioned above. The protective films float up to the surface and can be removed mechanically. The prepreg pieces remain in the liquid and can be delivered in a different manner.

EXAMPLE 2

In analogy to Example 1, glass fiber fabric impregnated with phenolic resin is separated from its protective films.

EXAMPLE 3

In analogy to Example 1, prepreg fabric impregnated with epoxy resin is separated from its protective films. The mechanical deformation for dividing the composite material takes place in this case by means of the roller belt described.

Although the invention has been described and illustrated in detail, it is to be clearly understood that the same is by way of illustration and example, and is not to be taken by way of limitation. The spirit and scope of the present invention are to be limited only by the terms of the appended claims.

What is claimed is:

1. Method for the single-type recovery of plastic materials from starting pieces of a multiple composite material, the method comprising the following steps for recovering pieces of prepreg fabric from flexible cutting residues, lined with films at least on one side, of prepreg webs or similar self-adhesive webs as starting pieces:

(i) cutting the starting pieces up into shreds of composite material;
   (ii) cooling the shreds of composite material down to temperatures below room temperature and, in a cold state, subjecting the shreds to a mechanical alternating bending stress and/or a shearing stress, the films being scaled off from the pieces of prepreg fabric without damaging either the films or pieces of prepreg fabric; and
   (iii) subjecting the mixture of films and pieces of prepreg fabric to a wet, density selective, flotation-like float and sink separation which modifies densities of the films and pieces of prepreg fabric using gas bubbles in a flotative manner and selectively differentiates the films from the pieces of prepreg fabric based on overall densities of combinations of gas bubbles with the films and with the pieces of prepreg fabric, wherein the films float and the pieces of prepreg fabric sink.

2. Method according to claim 1, wherein the cutting of the starting pieces includes cutting to shred sizes of about 1 to 250 cm$^2$, preferably to 10 to 80 cm$^2$.

3. Method according to claim 1, wherein the cooling of the shreds of composite material includes cooling them down to temperatures between +5° and −10° C., preferably to around the freezing point of water.

4. Method according to claim 1, wherein the cooling of the shreds of composite material takes place by dipping them into a cooling liquid.

5. Method according to claim 1, wherein the mechanical alternating bending stress and/or the shearing stress of the shreds of composite material likewise takes place in a suspension of cooling liquid used for said cooling.

6. Method according to claim 5, wherein the treatment liquid for the wet, flotation-like float and sink separation is the same liquid as the suspension and cooling liquid used in the mechanical alternating bending stress and/or the shearing stress.

7. Method according to claim 6, wherein water is used as a treatment liquid for said cooling.

8. Method according to claim 5, wherein the cooling liquid used in the cooling of the shreds of composite material is the same liquid as the suspension and cooling liquid used in the mechanical alternating bending stress and/or the shearing stress.

9. Method according to claim 8, wherein water is used as a treatment liquid for said cooling.

10. Method according to claim 9, wherein an antifreeze agent, in particular ethylene glycol, is added to the water used for the treatment.

11. Method according to claim 5, wherein water is used as a treatment liquid for said cooling.

12. Method according to claim 5, wherein the mechanical alternating bending stress of the shreds of composite material takes place by means of fulling between fulling rollers with a gearwheel-like profile.

13. Method according to claim 12, wherein the shreds of composite material are conveyed into a drawing-in side of a roller nip of the fulling rollers by the force of gravity.

14. Method according to claim 5, wherein the shreds of composite material are flushed into a drawing-in side of a roller nip of the fulling rollers by a directed flow.

15. Method according to claim 5, wherein the mechanical alternating bending stress of the shreds of composite material takes place between two flexible endless belts which lie one on top of the other, enclose the shreds of composite material between them, and are conducted in a meandering manner over a series of deflection rollers within a common course.

16. Method according to claim 1, wherein water is used as a treatment liquid for said cooling.

17. Method according to claim 16, wherein an antifreeze agent, in particular ethylene glycol, is added to the water used for the treatment.

18. Method according to claim 1, wherein the mechanical alternating bending stress of the shreds of composite material takes place by means of fulling between fulling rollers with a gearwheel-like profile.

19. Method according to claim 18, wherein the shreds of composite material are flushed into a drawing-in side of a roller nip of the fulling rollers by a directed flow.

20. Method according to claim 18, wherein the shreds of composite material are conveyed into a drawing-in side of a roller nip of the fulling rollers by the force of gravity.

21. Method according to claim 1, wherein the mechanical alternating bending stress of the shreds of composite material takes place between two flexible endless belts which lie one on top of the other, enclose the shreds of composite material between them, and are conducted in a meandering manner over a series of deflection rollers within a common course.

22. Method according to claim 1, wherein the prepreg pieces which have been freed from film residues and separated are freed from adhering treatment liquid by an airflow.

23. Method according to claim 22, wherein the predried, free prepreg pieces are dried completely in stagnant or slightly moving air at temperatures between 20° and 50° C.

24. Method according to claim 23, wherein the completely dried, free prepreg pieces are deposited to form a closed, preferably thin-layer web, and this loose deposit is rolled together to form a compact composite.

25. Method according claim 1, wherein multi-layer prepreg starting pieces are delaminated at the latest prior to the mechanical alternating bending stress and/or shearing stress to form at most double layer, preferably single-layer prepreg pieces.

26. Method according to claim 25, wherein the delamination takes place by means of a high energy jet of liquid, preferably water, shaped in the manner of a fan, which is directed parallel to the layers onto the cut edges of the multi-layer prepreg starting pieces.

27. Method for recovering plastic materials from starting pieces of composite fiber materials including fiber fabrics preimpregnated with a matrix plastic material forming prepreg structures covered by protective films, said method comprising:

mechanically comminuting the starting pieces into shreds of composite material, cooling the shreds of composite material to temperatures below ambient room temperature, subjecting the shreds of composite material to alternating mechanical stresses and thereby scaling off the protective films from the prepreg structures to form a mixture of film clippings and free prepreg pieces without damaging either the film clippings or free prepreg pieces, and subjecting the mixture of film clippings and free prepreg pieces to a wet density selective separation process which modifies densities of the film clippings and free prepreg pieces using gas bubbles in a flotative manner and selectively differentiates the film clippings from the free prepreg pieces based on overall densities of combinations of gas bubbles with the film clippings and with the free prepreg pieces, wherein the film clippings float and the free prepreg pieces sink.

28. Method according to claim 27, wherein said cooling and subjecting the shreds to alternating mechanical stresses is carried out in a liquid medium bath.

29. Method according to claim 28, wherein said liquid medium bath is a water bath.

30. Method according to claim 27, wherein said subjecting the mixture of film clippings and fare prepreg pieces to a wet density selection separation process is carried out in a liquid medium that is the same as a cooling medium for said cooling of the shreds.

31. Apparatus for recovering plastic materials from starting pieces of composite fiber materials including fiber fabrics preimpregnated with a matrix plastic material forming prepreg structures covered by protective films, said apparatus comprising the following sequential steps:

a comminuting device for mechanically comminuting the starting pieces into shreds of composite material, a cooling device for cooling the shreds of composite material to temperatures below ambient room temperature, a stressing device for subjecting the shreds of composite material to alternating mechanical stresses and thereby scaling off the protective films from the prepreg structures to form a mixture of film clippings and free prepreg pieces without damaging either the film clippings or free prepreg pieces, and a wet density selective separation device for subjecting the mixture of film clippings and free prepreg pieces to a wet density selective separation process by modifying densities of the film clippings and free prepreg pieces using gas bubbles in a flotative manner and selectively differentiating the film clippings from the free prepreg pieces based on overall densities of combinations of gas bubbles with the film clippings and with the free prepreg pieces, wherein the film clippings float and the free prepreg pieces sink.

32. Apparatus according to claim 31, wherein said cooling device includes a cooled liquid bath, and wherein said stressing device is immersed in said cooled liquid bath.

33. Apparatus according to claim 32, wherein said cooled liquid bath is a water bath, and wherein said wet density selective separating device includes a water bath communicating with the cooled liquid bath.

34. Method for recovering plastic materials from starting pieces of composite fiber materials including fiber fabrics preimpregnated with a matrix plastic material forming prepreg structures covered by protective films, said method comprising:

mechanically comminuting the starting pieces into shreds of composite material, cooling the shreds of composite material to temperatures below ambient room temperature, subjecting the shreds of composite material to alternating mechanical stresses and thereby scaling off the protective films from the prepreg structures to form a mixture of film clippings and free prepreg pieces without damaging either the film clippings or free prepreg pieces, and subjecting the mixture of film clippings and free prepreg pieces to a wet density selective separation process.

35. Apparatus for recovering plastic materials from starting pieces of composite fiber materials including fiber fabrics preimpregnated with a matrix plastic material forming prepreg structures covered by protective films, said apparatus comprising the following sequential steps:

a comminuting device for mechanically comminuting the starting pieces into shreds of composite material, a cooling device for cooling the shreds of composite material to temperatures below ambient room temperature, a stressing device for subjecting the shreds of composite material to alternating mechanical stresses and thereby scaling off the protective films from the prepreg structures to form a mixture of film clippings and free prepreg pieces without damaging either the film clippings or free prepreg pieces, and a wet density selective separation device for subjecting the mixture of film clippings and free prepreg pieces to a wet density selective separation process.

36. Method for recovering fiber fabric pieces preimpregnated with a matrix plastic material forming prepreg structures from starting pieces of composite fiber materials including the prepreg structures covered by protective films, the method comprising the steps of:

(a) mechanically comminuting the starting pieces into shreds of composite material;

(b) cooling the shreds of composite material to temperatures below ambient room temperature;

(c) step of forming a mixture of film clippings and prepreg structures; and (d) step of separating the film clippings from the prepreg structures.

* * * * *